United States Patent
Dolcetti et al.

(10) Patent No.: US 11,211,931 B2
(45) Date of Patent: Dec. 28, 2021

(54) SENSOR MAT PROVIDING SHIELDING AND HEATING

(71) Applicant: Joyson Safety Systems Acquisition LLC, Auburn Hills, MI (US)

(72) Inventors: Blaine J. Dolcetti, Oxford, MI (US); Phillip B. Maguire, Bloomfield Township, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 358 days.

(21) Appl. No.: 15/662,953

(22) Filed: Jul. 28, 2017

(65) Prior Publication Data

US 2019/0036527 A1     Jan. 31, 2019

(51) Int. Cl.
*H03K 17/96* (2006.01)
*H05K 9/00* (2006.01)
(Continued)

(52) U.S. Cl.
CPC ........... *H03K 17/962* (2013.01); *B60N 2/002* (2013.01); *B60N 2/5678* (2013.01); *B62D 1/046* (2013.01);
(Continued)

(58) Field of Classification Search
CPC ............... H03K 17/962; H03K 17/955; H03K 2217/960765; H03K 2217/960775;
(Continued)

(56) References Cited

U.S. PATENT DOCUMENTS

| 4,540,979 A | 9/1985 | Gerger et al. |
| 4,631,976 A | 12/1986 | Noda et al. |

(Continued)

FOREIGN PATENT DOCUMENTS

| CN | 202956124 A | 5/2013 |
| CN | 104684764 A | 6/2015 |

(Continued)

OTHER PUBLICATIONS

Comeford, "Proximity Sensing Solutions, Part1: Capacitive Sensors", DigiKey Electronics, Sep. 19, 2013, 3 pages.
(Continued)

*Primary Examiner* — Phuong T Nguyen
*Assistant Examiner* — Yeong Juen Thong
(74) *Attorney, Agent, or Firm* — Meunier Carlin & Curfman LLC

(57) ABSTRACT

According to various implementations, a sensor mat includes a mat substrate, a sensor electrode, and a shield electrode. At least a portion of the sensor and shield electrodes are spaced apart from and parallel to each other on a first surface of the mat substrate. The shield electrode is electrically coupled to a voltage source to create a capacitance between the shield electrode and the sensor electrode, and the sensor electrode is used to detect a change in the capacitance. The shield electrode may also be alternately used for heating the surface of the vehicle part adjacent the mat. For example, the sensor may be disposed adjacent a portion of a steering wheel or a seat assembly and is used for sensing presence of an occupant's hands or body adjacent the steering wheel or seat assembly.

11 Claims, 3 Drawing Sheets

(51) Int. Cl.
   *B62D 1/04*     (2006.01)
   *B60N 2/00*     (2006.01)
   *B60N 2/56*     (2006.01)
   *B62D 1/06*     (2006.01)
   *H03K 17/955*   (2006.01)

(52) U.S. Cl.
   CPC ........... *B62D 1/065* (2013.01); *H03K 17/955* (2013.01); *H05K 9/0071* (2013.01); *H03K 2217/960765* (2013.01); *H03K 2217/960775* (2013.01)

(58) Field of Classification Search
   CPC ...... B62D 1/065; B62D 1/046; B60N 2/5678; B60N 2/002; H05K 9/0071
   USPC ....... 219/202, 209, 211, 488, 489, 490, 497, 219/525, 480, 528, 541, 539, 544
   See application file for complete search history.

(56) References Cited

U.S. PATENT DOCUMENTS

| | | | |
|---|---|---|---|
| 4,926,025 A * | 5/1990 | Wilhelm | B60H 1/2218 219/202 |
| 5,563,354 A | 10/1996 | Kropp | |
| 6,016,103 A | 1/2000 | Leavitt | |
| 6,249,130 B1 | 6/2001 | Greer | |
| 6,333,736 B1 | 12/2001 | Sandbach | |
| 6,392,542 B1 | 5/2002 | Stanley | |
| 6,501,463 B1 | 12/2002 | Dahley et al. | |
| 6,590,499 B1 | 7/2003 | D'Agosto | |
| 6,906,700 B1 | 6/2005 | Armstrong | |
| 6,918,610 B2 | 7/2005 | Song et al. | |
| 7,126,583 B1 | 10/2006 | Breed | |
| 7,521,940 B2 * | 4/2009 | Koch | B60N 2/002 324/661 |
| 7,649,278 B2 | 1/2010 | Yoshida | |
| 7,688,213 B2 | 3/2010 | Power | |
| 7,830,265 B2 | 11/2010 | Power | |
| 7,928,341 B2 | 4/2011 | Ito et al. | |
| 8,011,234 B2 | 9/2011 | Kandler | |
| 8,269,731 B2 | 9/2012 | Molne | |
| 8,367,987 B2 * | 2/2013 | Ishii | H01C 1/01 219/545 |
| 8,564,424 B2 | 10/2013 | Evarts et al. | |
| 8,698,764 B1 | 4/2014 | Karakotsios et al. | |
| 8,952,907 B2 | 2/2015 | Brown et al. | |
| 8,983,732 B2 | 3/2015 | Lisseman et al. | |
| 9,007,190 B2 | 4/2015 | Bosch et al. | |
| 9,248,851 B2 | 2/2016 | Van'tZelfde et al. | |
| 9,643,560 B2 | 5/2017 | Honmatsu et al. | |
| 2004/0267422 A1 | 12/2004 | Bossler et al. | |
| 2005/0052426 A1 | 3/2005 | Hagermoser et al. | |
| 2005/0273218 A1 | 12/2005 | Breed et al. | |
| 2006/0025897 A1 | 2/2006 | Shostak et al. | |
| 2006/0066085 A1 | 3/2006 | Durocher | |
| 2006/0109256 A1 | 5/2006 | Grant et al. | |
| 2006/0177212 A1 | 8/2006 | Lamborghini et al. | |
| 2006/0187038 A1 * | 8/2006 | Shieh | G01B 7/14 340/562 |
| 2006/0231320 A1 | 10/2006 | Kamizono et al. | |
| 2006/0248478 A1 | 11/2006 | Liau | |
| 2006/0262103 A1 | 11/2006 | Hu et al. | |
| 2006/0284839 A1 | 12/2006 | Breed et al. | |
| 2007/0029768 A1 | 2/2007 | Clos et al. | |
| 2007/0208529 A1 * | 9/2007 | Koch | G01D 21/02 702/139 |
| 2008/0011732 A1 * | 1/2008 | Ito | B60N 2/002 219/217 |
| 2008/0202912 A1 | 8/2008 | Boddie et al. | |
| 2009/0001855 A1 | 1/2009 | Lipton et al. | |
| 2009/0008377 A1 * | 1/2009 | Nathan | B60N 2/5685 219/217 |
| 2009/0160529 A1 | 6/2009 | Lamborghini et al. | |
| 2010/0053087 A1 | 3/2010 | Dai et al. | |
| 2010/0187216 A1 * | 7/2010 | Komada | H03K 17/962 219/443.1 |
| 2010/0231239 A1 | 9/2010 | Tateishi et al. | |
| 2010/0250071 A1 | 9/2010 | Pala et al. | |
| 2010/0268426 A1 | 10/2010 | Pathak et al. | |
| 2010/0277186 A1 | 11/2010 | Bieck et al. | |
| 2010/0315267 A1 | 12/2010 | Chung et al. | |
| 2011/0037721 A1 | 2/2011 | Cranfill et al. | |
| 2011/0133919 A1 | 6/2011 | Evarts et al. | |
| 2011/0148648 A1 | 6/2011 | Fischer et al. | |
| 2011/0175844 A1 | 7/2011 | Berggren | |
| 2011/0210926 A1 | 9/2011 | Pasquero et al. | |
| 2011/0216015 A1 | 9/2011 | Edwards | |
| 2011/0290038 A1 | 12/2011 | Hoshino et al. | |
| 2012/0038468 A1 | 2/2012 | Provancher | |
| 2012/0126965 A1 | 5/2012 | Sanma et al. | |
| 2012/0232751 A1 | 9/2012 | Guspan | |
| 2012/0296528 A1 | 11/2012 | Wellhoefer et al. | |
| 2013/0009654 A1 | 1/2013 | Kandler et al. | |
| 2013/0027065 A1 * | 1/2013 | Stanley | B60N 2/002 324/705 |
| 2013/0277351 A1 | 10/2013 | Lamesch | |
| 2014/0076063 A1 | 3/2014 | Lisseman et al. | |
| 2014/0092025 A1 | 4/2014 | Pala et al. | |
| 2014/0197942 A1 * | 7/2014 | Tabaczynski | B60N 2/5685 340/457.1 |
| 2014/0224040 A1 | 8/2014 | Van'tZelfde et al. | |
| 2015/0054317 A1 | 2/2015 | Fortune et al. | |
| 2015/0205421 A1 | 7/2015 | Lin et al. | |
| 2016/0282986 A1 * | 9/2016 | Marques | G06F 3/04182 |

FOREIGN PATENT DOCUMENTS

| | | |
|---|---|---|
| DE | 102012000572 | 7/2013 |
| JP | 2007114122 | 5/2007 |

OTHER PUBLICATIONS

International Search Report and Written Opinion dated Dec. 27, 2017, issued for International Application No. PCT/US2017/044375.

Office Action issued for Chinese Application No. 201780095376, dated Sep. 30, 2021. Machine Translation included.

* cited by examiner

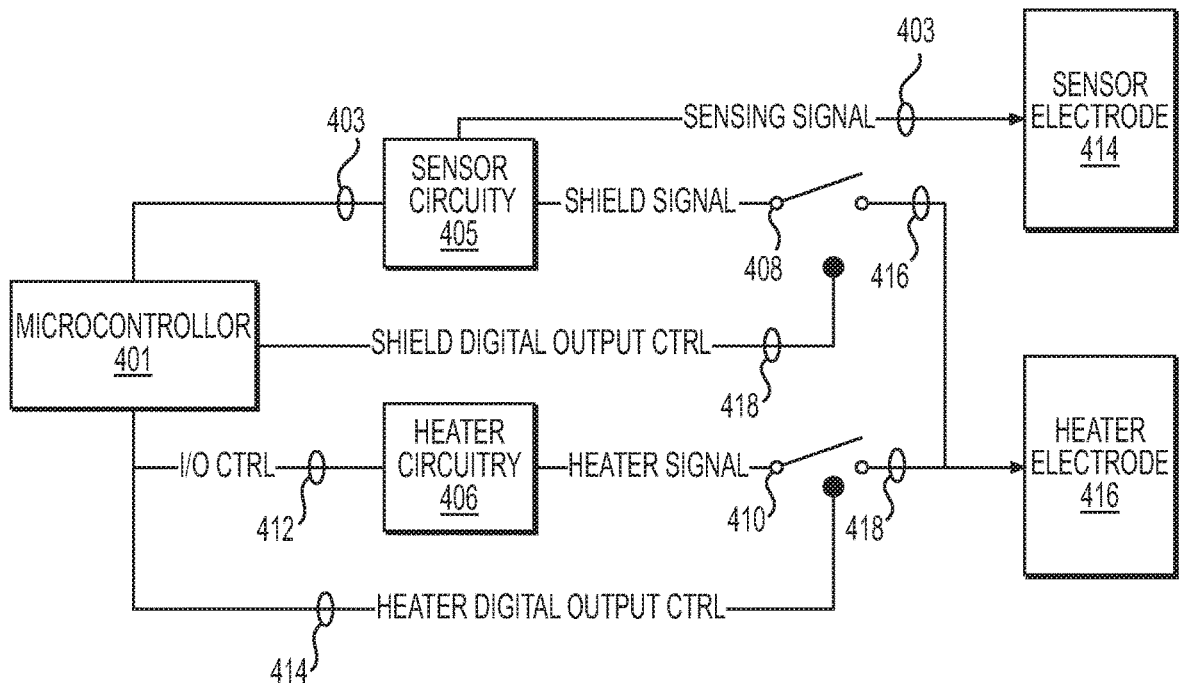

FIG. 4A

| SHIELD DIGITAL OUTPUT CONTROL = 0 | HEATER DIGITAL OUTPUT CONTROL = 0 | HEATER ELECTRODE WILL NOT BE USED |
|---|---|---|
| SHIELD DIGITAL OUTPUT CONTROL = 1 | HEATER DIGITAL OUTPUT CONTROL = 0 | HEATER ELECTRODE WILL BE USED FOR SHIELDING |
| SHIELD DIGITAL OUTPUT CONTROL = 0 | HEATER DIGITAL OUTPUT CONTROL = 1 | HEATER ELECTRODE WILL BE USED FOR HEATING |
| SHIELD DIGITAL OUTPUT CONTROL = 1 | HEATER DIGITAL OUTPUT CONTROL = 1 | HEATER ELECTRODE WILL BE USED FOR HEATING |

SENSOR MAT PROVIDING SHIELDING AND HEATING

CROSS REFERENCE TO RELATED APPLICATIONS

None.

BACKGROUND

Heating and sensing systems for use in vehicles presently include multiple layers of mats, including a heater mat for heating a surface adjacent the heater mat, a separate sensing mat for sensing the presence of an occupant adjacent the sensing mat, and a shielding mat disposed between the sensing mat and a frame of the vehicle part on which the sensing and heating mat are disposed. The shielding mat prevents parasitic capacitance between the frame and the sensing mat. However, placing multiple mats around a vehicle part can be cumbersome for manufacturing and requires additional costs and materials.

Thus, an improved sensor mat having the ability to heat and avoid parasitic capacitance with the frame of the vehicle part adjacent thereto is needed in the art.

BRIEF SUMMARY

According to various implementations, a sensor mat includes a mat substrate, a sensor electrode, and a shield electrode. At least a portion of the sensor and shield electrodes are spaced apart from and parallel to each other on a first surface of the mat substrate within a common plane. The shield electrode is electrically coupled to a voltage source to create a capacitance between the shield electrode and the sensor electrode, and the sensor electrode is used to detect a change in the capacitance. For example, the sensor electrode detects a change in capacitance in response to the presence of a conductive object, such as a human hand, on or near the sensor electrode. In some implementations, the sensor mat may be wrapped around a rim of a steering wheel assembly, placed below an air bag cover or a bezel of a steering wheel assembly, or placed below a seat cover in a vehicle to detect presence of an occupant and/or that the occupant is touching the steering wheel assembly adjacent the sensor mat.

Other various implementations include a method of sensing operator contact with a portion of a vehicle. The method includes (1) disposing a sensor mat adjacent a portion of the vehicle, (2) controlling a voltage source to cause a first current to flow through a shield electrode of the sensor mat to shield the sensor electrode from parasitic capacitance, and (3) controlling the voltage source to cause a second current to flow through the shield electrode to heat the sensor mat. The second current is greater than the first current. The sensor mat includes a mat substrate, a sensor electrode disposed adjacent the first surface of the mat substrate, and the shield electrode disposed adjacent the first surface of the mat substrate. At least a portion of the shield electrode is spaced apart from and parallel to and is within the same plane as at least a portion of the sensor electrode, and the shield electrode is electrically coupled to a voltage source to create a capacitance between the shield electrode and the sensor electrode. The sensor electrode is used to detect a change in the capacitance.

BRIEF DESCRIPTION OF THE DRAWINGS

These and other features, aspects, and advantages of the present invention will become apparent from the following description and the accompanying exemplary implementations shown in the drawings, which are briefly described below.

FIG. 4A illustrates a schematic electrical diagram according to one implementation.

FIG. 4B illustrates a logic table implementing the circuit of FIG. 4A as described herein.

DETAILED DESCRIPTION

Figure 1:
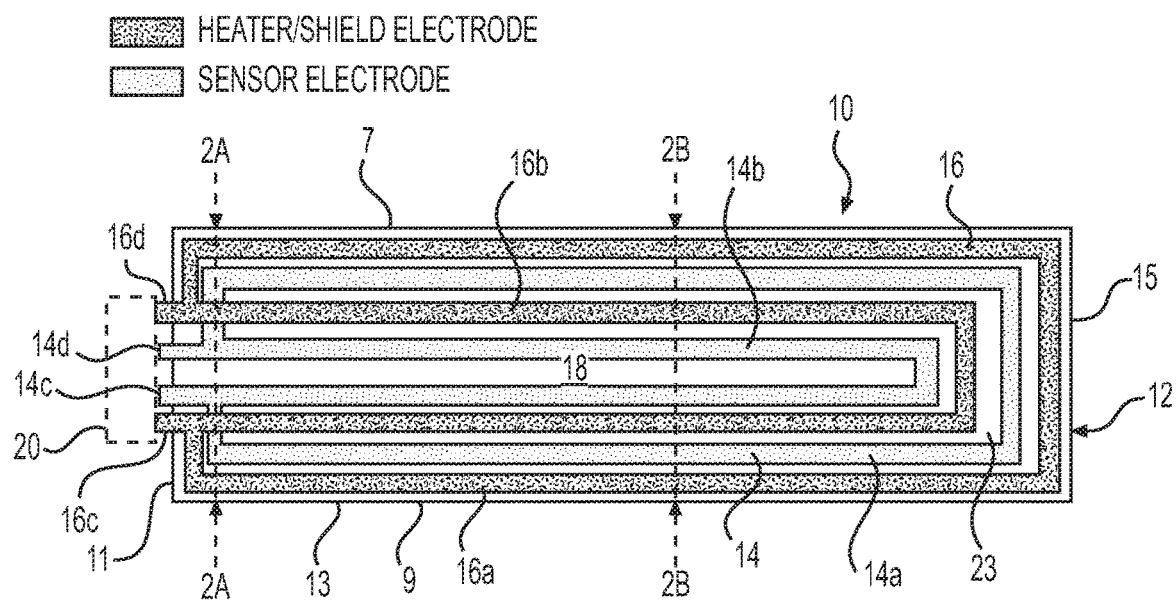
FIG. 1 illustrates a top view of a sensor mat according to one implementation.

According to various implementations, a sensor mat includes a mat substrate 12, a sensor electrode 14, and a shield electrode 16. At least a portion of the sensor and shield electrodes 14, 16 are spaced apart from and parallel to each other on a first surface 18 of the mat substrate 12 within a plane. The shield electrode 16 is electrically coupled to a voltage source within system circuitry to create a capacitance between the shield electrode 16 and the sensor electrode 14, and the sensor electrode 14 is used to detect a change in the capacitance between the electrodes. For example, the sensor electrode detects a change in capacitance in response to the presence of a conductive object, such as a human hand, on or near the portion of the sensor electrode that is parallel to the shield electrode. In some implementations, the sensor mat 10 may be wrapped around a rim of a steering wheel assembly, placed below an air bag cover or a bezel of a steering wheel assembly, or placed below a seat cover in a vehicle to detect presence of an occupant and/or that the occupant is touching the steering wheel assembly adjacent the sensor mat. This sensor mat described herein reduces the amount of layers needed to sense and allow for heating options along a portion of a vehicle surface.

Detection systems disclosed herein, such as the system of FIGS. 4A and 4B may include a microcontroller 401 or any processor or electronic control unit (ECU) that controls occupant detection and receives various measurements from the system components (e.g., the sensor electrode 414, heater/shield electrode 416 and associated switches 408, 410). The microcontroller 401 may be configured to interact with other vehicle systems such as, for example, vehicle safety systems (e.g., airbag and seat belt systems). The microcontroller may provide a signal to other vehicle safety systems or accessory systems to monitor a vehicle occupant's experience in the vehicle. A microcontroller 401 used herein for the occupant detection analysis may be integrated with a separate controller for another vehicle system such as, for example, the controller used for a vehicle safety system.

Figure 2A:
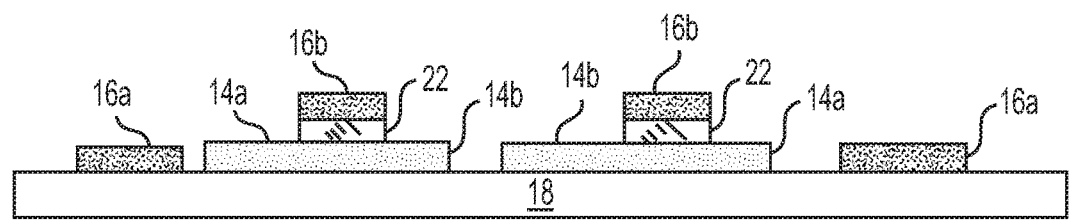
FIG. 2A illustrates a cross sectional view of the sensor mat of FIG. 1 taken through the 2A-2A line.
Figure 2B:
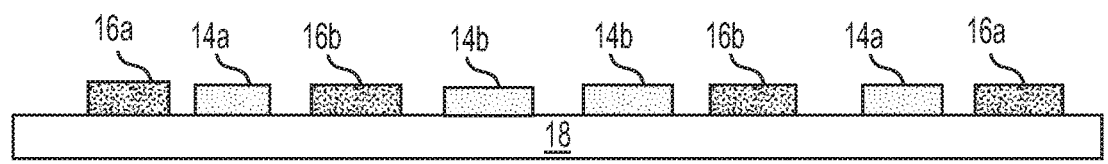
FIG. 2B illustrates a cross sectional view of the sensor mat of FIG. 1 taken through the 2B-2B line.

The electrodes 414, 416 may be constructed as shown according to the example electrodes 14, 16 illustrated in more detail in FIGS. 1 and 2. These figures show one implementation of a sensor mat 10 incorporating a sensor electrode 14 and a shield/heater electrode 16. The sensor mat 10 includes mat substrate 12, sensor electrode 14, and shield electrode 16. The mat substrate 12 has a first surface 18 on which the sensor electrode 14 and the shield electrode 16 are disposed. In some embodiments, the capacitance at issue in this disclosure is that between the sensor electrode 14 and the shield electrode 16, and the spacing 23 between the electrodes exhibits capacitance when a voltage is applied to one of the electrodes, typically the shield electrode 16, 416 (FIG. 4). In other embodiments, a dielectric material 22 may be disposed on the first surface 18 and/or between the electrodes 14, 16. For example, the dielectric material 22 shown in FIG. 2A is overlaid on and between the electrodes 14, 16 at points where the structure of the system requires the electrode paths to cross. In other non-limiting embodiments, this dielectric material 22 may further extend over a first surface 18 of the mat substrate 12 on which the electrodes 14, 16 are positioned.

In the arrangement shown in FIG. 1, the mat substrate 12 has an outer perimeter 13 that includes a first end 11 and a second end 15 that is spaced apart from the first end 11. A first side 7 and a second side 9 are also opposite one another and connect to the ends 11, 15 of the mat substrate 12 to complete the perimeter 13. In some embodiments of this disclosure, components are described as being positioned relative to one another, and without limiting the scope of the embodiments, a convenient perspective is provided by considering the first surface 18 of the mat substrate to provide a horizontal reference point. Objects on the substrate may extend laterally along a horizontal axis running from the first side 7 to the second side 9 or longitudinally from the first end 11 to the second end 15. Components on the substrate may be considered to have a height or thickness determined by a dimension that extends vertically from the first surface 18 of the mat substrate 12.

One characteristic of the disclosed object sensing system is that the electrical components on the substrate, particularly the sensor electrode 14 and the shield electrode 16, are arranged in non-overlapping patterns that may be considered concentric, at least along at least a portion of the mat substrate 12. In the non-limiting example of FIG. 1, the shield electrode 16 includes an outer portion 16a operatively connected to an inner portion 16b. The outer portion 16a defines a boundary adjacent an outer perimeter 13 of the mat substrate 12. In the implementation shown in FIG. 1, the outer portion 16a defines a generally U-shaped boundary. The inner portion 16b of the shield electrode 16 is spaced inwardly and apart from the outer portion 16a. In the implementation shown in FIG. 1, the inner portion 16b is also rectangular shaped. Two leads 16c, 16d of the shield electrode 16 extend between a junction of the outer portion 16a and the inner portion 16b to the first end 11 of the mat substrate 12. The leads 16c, 16d are coupled to the controller 20.

The sensor electrode 14 also includes an outer portion 14a and an inner portion 14b. The outer portion 14b is disposed between the inner portion 16b and outer portions 16a of the shield electrode 16, and the inner portion 14b is disposed between the inner areas making up shield inner portion 16b. Two leads 14c, 14d of the sensor electrode 14 extend between a junction of the outer portion 14a and the inner portion 14b to the first end 11 of the mat substrate 12. The leads 14c, 14d are coupled to the controller 20. Portions of the sensor electrode 14 and the shield electrode 16 cross adjacent the first end 11, and dielectric material 22 is disposed between these portions. In another sense, the shield electrode 16 and the sensor electrode 14 comprise electrode sections that alternate, from side 7 to side 9 from shield electrode section to sensor electrode section with spacing 23 there between. This kind of laterally disposed arrangement of alternating sensing and shielding electrode sections may just as easily run from end to end in other embodiments.

Figure 3:
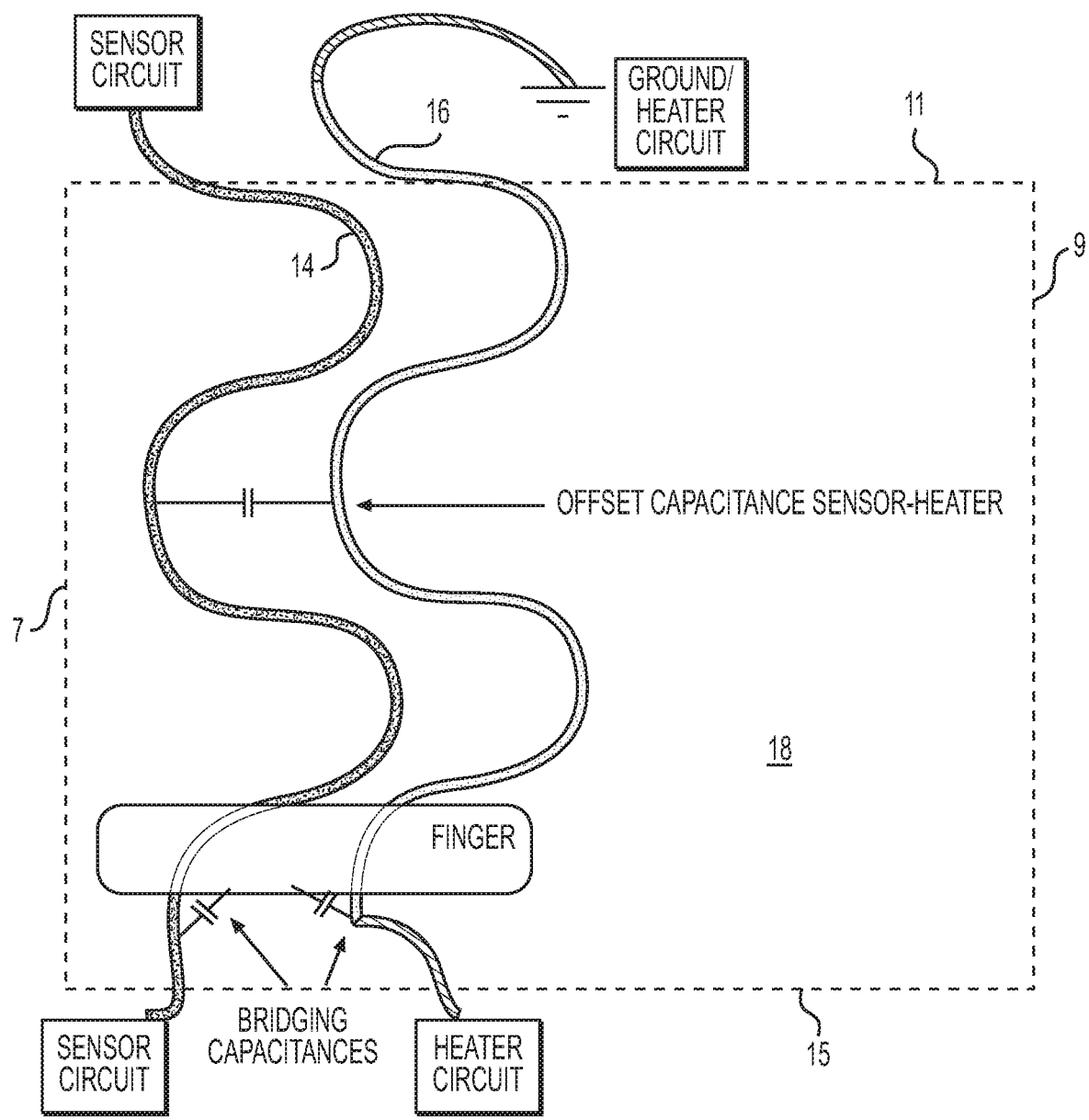
FIG. 3 illustrates a top view of a sensor mat according to another implementation described herein.

Along the lines of other implementations, the shield 16 and sensor electrodes 14 may be disposed in other non-rectangular arrangements, such as the sinusoidal shaped arrangement shown in FIG. 3. FIG. 3 illustrates how the sensor electrode 14 and the shield/heater electrode 16 may be positioned in a laterally offset relationship in a horizontal plane, wherein the upper surface 18 of the sensor mat 10 is considered a horizontal plane and the lateral offset is between the first side 7 and the second side 9 in FIG. 1. The sensor mat surface supports the electrodes and extends laterally between sections of the electrodes. Other non-overlapping shapes of the sensor and shield electrodes 14, 16 are within the scope of this disclosure and will result in a substantially flat arrangement for a sensor and shield system on a sensor mat 10 as disclosed. By placing the sensor electrode 14 and the shield electrode 16 in a common plane, the mat 10 is configured for use in more locations in a vehicle without adding bulk, unevenness, and/or unnecessary thickness to the sensing system. The mat 10 is also configured for wrapping around vehicle components such as a steering wheel in the vehicle. In this embodiment, the mat 10 and the sensors 14, 16 are sufficiently flexible for bending and wrapping without losing sensing, shielding and/or heating functionality with proper consideration for capacitance between the electrodes. Embodiments of this disclosure referencing the electrodes 14, 16 as being in a common plane are not meant to be limiting in any way, but instead the plane discussed herein emphasizes that the position of the electrodes 14, 16 on the mat 10 results in a flat arrangement with the sensors having a parallel and possibly uniform thickness, or height dimension, disposed vertically from the first surface 18 of the mat.

In some implementations, the sensor electrode 14 and shield electrode 16 are conductive wires coupled to the mat substrate 12, such as by sewing them to the mat substrate 12, adhering (e.g., gluing) them to the mat substrate 12, or printing conductive ink onto the first surface 18 of the mat substrate 12. The sensor and shield electrodes 14, 16 may also be any substantially flat, flexible, elongated conductors such as those available in strips or other shapes conducive to concentric patterning on the mat 10. FIG. 1 illustrates that the spacing 23 on the mat 10 between the sensor electrode 14 and the shield electrode 16 is designed, dimensionally and structurally, to result in a electrical capacitance between the non-overlapping portions of the sensor electrode 14 and shield electrode 16, due to the electric fields that can be induced within the spacing 23.

As shown in the implementation in FIG. 4, the electrical capacitance can be induced when the sensor 14 and shield electrodes 16 are coupled to a controller 20 that provides a voltage source to the shield electrode 16 and receives a capacitance signal from the sensor electrode 14. The voltage source is controllable by the controller 20 to cause a first current or a second current to flow through the shield electrode 16. The voltage applied to the shield electrode 16 creates a capacitance between the shield electrode 16 and the sensor electrode 14. The signal received from the sensor electrode 14 by the controller 20 detects a change in capacitance in the sensor electrode 14, which can be used to determine the presence of an occupant or portion of the occupant's body adjacent the sensor mat 10. The first current shields the sensor electrode 14 from parasitic capacitance from a vehicle part frame or other conductive material that is not intended to be sensed by the sensor electrode 14, and the second current heats the sensor mat 10. The first current is smaller than the second current. For example, the first current may be less than 5 mA, and the second current may be between 5 A and 10 A. FIG. 4B illustrates the logic table that can be used in one non-limiting embodiment to provide the heating, shielding, and sensing operations that switch as shown to implement the embodiments of this disclosure.

It bears noting that the embodiments of FIGS. 4A and 4B incorporate certain object presence sensor technology by which the sensor electrode 14 is consistently configured to sense a touch from a vehicle occupant, a conductive object (including a live occupant) in close proximity to the sensor electrode 14, or a conductive object in either direct or indirect contact with the sensor electrode 14. The system described herein is operable when the occupant touch or contact is indirect, i.e., a layer of material such as a seat cover or steering wheel leather, is between an occupant and the actual electrodes. Furthermore, when any signal, whether heating or shielding, is present on the shielding electrode, a capacitance exhibited about the sensor electrode may be tracked by the system electronics. In operation, however, the logical procedures of software programmed into the microcontroller 401 shown in FIG. 4A ensures greater accuracy in both sensing the presence of an occupant at certain time periods and providing the heating function that the occupant desires at other time periods. The embodiments presented herein include all available options for data signal transmission and data multiplexing options for the sensing, heating and shielding control signals and respective outputs on the shield sensor 16 to switch between heating and shielding periodically over a time span while an occupant is engaging a steering wheel or other part of a vehicle. In yet another non-limiting example, the switching between shielding and heating may occur along known and periodic spans of time programmed into the microcontroller control systems. As shown in FIG. 4A, the microcontroller provides input and output control signals 403, 412, 414 to activate the sensing, shielding, and heating functions respectively via sensor circuitry 405 and heater circuitry 406 connected to the electrodes via proper conduits for communicating with sensing signals 403, shield signal 416, and heater signal 418.

In some implementations, the shield electrode 16 is grounded to provide reference values in modeling the capacitive response of the sensor electrode 14, 414 and the shield electrode 16, 416. Grounding the shield electrode 16 creates an offset capacitance, operating in parallel to the measured and variable capacitance, between the sensor electrode 14 and the shield electrode 16. This offset capacitance, illustrated by example in FIG. 3, can be nulled out as a known constant offset. Also shown in FIG. 3, when the shield/heater electrode 16, 416 is grounded, the configuration of the electrodes allows bridging between the sensor electrode 14 and the shield electrode 16 to create a larger capacitive signal when a conductive body part (e.g., a finger) is applied across the electrodes 14, 16.

The distance between the parallel portions of the shield electrode 16 and sensor electrode 14 is selected to increase the sensitivity of the capacitive signal. For example, exemplary spacing ranges are between 1 mm and 7 mm.

In some implementations, the sensor mat 10 is flexible. For example, the mat substrate 12 may be made from a flexible material, such as the leather or vinyl skin installed over a steering wheel assembly or a seat assembly. Other exemplary materials include any non-conductive materials, such as foam, felt, PET, etc. The layer of dielectric material 22 that may be disposed in the mat substrate 12 material or on the first surface 18 thereof may also be sufficiently flexible to meet the requirements for the installation at hand. Any non-conductive material, including ambient air between the sensor electrode 14 and shield electrode 16, may be used as the dielectric material 22.

As noted above, the single layer construction of the system described herein allows for the distance between the electrodes and the surface of the vehicle part to be reduced, which improves sensing and heating capabilities.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The implementation was chosen and described in order to best explain the principles of the invention and the practical application, and to enable others of ordinary skill in the art to understand the invention for various implementations with various modifications as are suited to the particular use contemplated.

The invention claimed is:

1. A sensor mat system comprising:
a mat substrate;
a voltage source connected to a microcontroller implementing software comprising computer commands implementing a shield digital output control signal and a heater digital output control signal with the microcontroller;
a sensor electrode disposed on a first surface of the mat substrate, at least a portion of the sensor electrode being disposed in a plane; and
a shield electrode disposed on the first surface of the mat substrate, at least a portion of the shield electrode being spaced apart from and in the same plane as the at least a portion of the sensor electrode,
wherein the shield electrode is electrically coupled to the voltage source and a capacitance exists across the first surface between non-overlapping portions of the shield electrode and the sensor electrode, said sensor electrode used to detect a change in the capacitance; and
wherein the voltage source is controllable to cause a first current to flow through the shield electrode according to the shield digital output control signal being in an on state and the heater digital output control signal being in an off state;
wherein the voltage source is controllable to cause a second current to flow through the shield electrode according to the shield digital output control signal being in an off state and the heater digital output control signal being in an on state;
wherein the first current is smaller than the second current; and
at least one switch connected to the voltage source and the microcontroller and switching the first current and the second current between shielding and heating according to the software,
wherein the sensor electrode and shield electrode are conductive wires coupled to the mat substrate;
wherein at least one dielectric material is disposed adjacent the sensor electrode and shield electrode;
wherein the shield electrode defines a boundary, and the sensor electrode is disposed within the boundary.

2. The sensor mat system of claim 1, wherein the voltage source provides the first current and the second current to the shield electrode, wherein the first current is configured for sensing a presence of a conductive object on or near the sensor electrode, and wherein the second current on the shield electrode energizes the shield electrode and heats the sensor mat.

3. The sensor mat system of claim 1, wherein at least a portion of the mat substrate comprises the dielectric material.

4. The sensor mat system of claim 1, wherein the shield electrode is grounded.

5. The sensor mat system of claim 1, wherein the sensor mat is flexible.

6. The sensor mat system of claim 1, wherein the sensor electrode comprises an outer portion and an inner portion, and the shield electrode comprises a respective outer portion and a respective inner portion;
   wherein the outer portion of the sensor electrode is disposed between the respective inner portion and the respective outer portion of the shield electrode; and
   wherein the inner portion of the sensor electrode is disposed within the respective inner portion of the shield electrode.

7. A method of sensing operator contact with a portion of a vehicle, the method comprising:
   disposing a sensor mat adjacent a portion of the vehicle, the sensor mat comprising:
   a mat substrate;
   conductive wires coupled to the mat substrate to form a sensor electrode and a shield electrode;
   wherein at least a portion of the shield electrode defines a boundary on the mat substrate, and the sensor electrode is positioned within the boundary;
   the sensor electrode disposed on a first surface of the mat substrate, at least a portion of the sensor electrode being disposed in a plane; and
   the shield electrode disposed on the first surface of the mat substrate, at least a portion of the shield electrode being spaced apart from and within the same plane as the at least a portion of the sensor electrode,
   at least one dielectric material adjacent the sensor electrode and the shield electrode;
   wherein the shield electrode is electrically coupled to a voltage source and a capacitance exists across the first surface between the shield electrode and the sensor electrode, said sensor electrode used to detect a change in the capacitance;
   controlling the voltage source with a microcontroller executing software comprising computer commands implementing a shield digital output control signal and a heater digital output control signal with the microcontroller;
   causing a first current to flow through the shield electrode to shield the sensor electrode from parasitic capacitance exhibited between the sensor electrode and a frame supporting the portion of the vehicle;
   causing a second current to flow through the shield electrode to heat the sensor mat, the second current being greater than the first current;
   wherein the voltage source is controllable to cause the first current to flow through the shield electrode according to the shield digital output control signal being in an on state and the heater digital output control signal being in an off state;
   wherein the voltage source is controllable to cause the second current to flow through the shield electrode according to the shield digital output control signal being in an off state and the heater digital output control signal being in an on state; and
   switching the first current and the second current applied to the shield electrode to produce a corresponding switch between shielding and heating.

8. The method of claim 7, sensor mat further comprises the dielectric material disposed on at least a portion of the mat substrate between the sensor electrode and the shield electrode.

9. The method of claim 7, further comprising grounding the shield electrode.

10. The method of claim 7, wherein the mat substrate comprises a flexible mat substrate.

11. The method of claim 7, wherein the voltage source is connected to a microcontroller and configured to provide both the first current and the second current.

* * * * *